(12) United States Patent
Leobandung (10) Patent No.: US 11,789,062 B2
(45) Date of Patent: Oct. 17, 2023

(54) USAGE METERING TO PREVENT IC COUNTERFEIT

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 52 days.

(21) Appl. No.: 17/528,340

(22) Filed: Nov. 17, 2021

(65) Prior Publication Data

US 2023/0152365 A1 May 18, 2023

(51) Int. Cl.
*G01R 31/26* (2020.01)

(52) U.S. Cl.
CPC ................................ *G01R 31/2642* (2013.01)

(58) Field of Classification Search
None
See application file for complete search history.

(56) References Cited

U.S. PATENT DOCUMENTS

| | | | |
|---|---|---|---|
| 8,260,708 B2 | 9/2012 | Potkonjak | |
| 9,513,329 B2 | 12/2016 | Potkonjak | |
| 9,791,499 B2 | 10/2017 | Jenkins et al. | |
| 10,295,589 B2 | 5/2019 | Jenkins et al. | |
| 10,634,714 B2 | 4/2020 | Le et al. | |
| 2011/0068818 A1* | 3/2011 | Fukami | G01R 31/2642 324/762.01 |
| 2018/0156859 A1 | 6/2018 | Takeuchi et al. | |
| 2021/0091670 A1* | 3/2021 | Bayer et al. | G01R 19/16528 |

OTHER PUBLICATIONS

Choi et al., "Effect of Metal Line Width on Electromigration of BEOL Cu Interconnects", In 2018 IEEE International Reliability Physics Symposium (IRPS) Mar. 11, 2018 (pp. 4F-4). IEEE.

\* cited by examiner

*Primary Examiner* — Patrick Assouad
*Assistant Examiner* — Haidong Zhang
(74) *Attorney, Agent, or Firm* — Tutunjian & Bitetto, P.C.; Samuel Waldbaum (57) ABSTRACT

A timer circuit includes a plurality of n-type field effect transistors (NFETs) powered by a current source, a plurality of electromigration detection elements each electrically connected to a respective NFET of the plurality of NFETs, and a read-out circuit electrically connected to the plurality of electromigration detection elements to meter usage of each of the NFETs.

20 Claims, 4 Drawing Sheets

|  | NFET 1 | NFET 2 | NFET 3 | NFET 4 | NFET 5 | NFET 6 | NFET 7 |
|---|---|---|---|---|---|---|---|
| EMX Cu Line | 1 month | 1 month | 1 month | 1 month | 1 month | 1 month | 1 month |
| T1 | ON | OFF | OFF | OFF | OFF | OFF | OFF |
| V | ~0V | ~0V | ~0V | ~0V | ~0V | ~0V | ~0V |
| T2 | OFF | ON | OFF | OFF | OFF | OFF | OFF |
| V | Vdd | ~0V | ~0V | ~0V | ~0V | ~0V | ~0V |
| T3 | OFF | OFF | ON | OFF | OFF | OFF | OFF |
| V | Vdd | Vdd | ~0V | ~0V | ~0V | ~0V | ~0V |
| READOUT |  |  | 110000 |  |  |  |  |

For 7 NFETS, READOUT = 3 months...(i.e., chip has been powered up by ~3 months)

USAGE METERING TO PREVENT IC COUNTERFEIT

BACKGROUND

The present invention relates generally to chip manufacturing, and more specifically, to electromigration detection in usage metering to prevent integrated circuit (IC) counterfeits.

There is a growing challenge in the area of electro-migration (EM) failure for integrated circuit (IC) products, driven mainly by aggressive scaling of interconnect wires. At a high level, EM is the transport of material caused by the gradual movement of the ions in a conductor due to the momentum transfer between conducting electrons and diffusing metal atoms. For example, EM is an electronic-current-induced diffusion due to an electron wind force on metal atoms in the interconnect wires and other conductors in integrated circuit products. This force originates from scattering events with flowing electrons, whereby atoms migrate via a vacancy exchange mechanism. EM is process-dependent, materials-dependent, and layout-specific and is accelerated by higher temperature and current density.

However, EM can be beneficially used to determine chip lifetimes.

SUMMARY

In accordance with an embodiment, a timer circuit is provided. The timer circuit includes a plurality of n-type field effect transistors (NFETs) powered by a current source, a plurality of electromigration detection elements each electrically connected to a respective NFET of the plurality of NFETs, and a read-out circuit electrically connected to the plurality of electromigration detection elements to meter usage of each of the NFETs.

In accordance with another embodiment, a timer circuit is provided. The timer circuit includes an N number of n-type field effect transistors (NFETs), wherein a drain of each NFET from 1 to N-1 connects to a junction, and wherein a first branch of the junction connects to a gate of a subsequent NFET, electromigration elements each associated with an NFET and each connected to a second branch of the junction, and a read-out circuit connected to the electromigration elements.

In accordance with yet another embodiment, a method is provided. The method includes powering a plurality of n-type field effect transistors (NFETs) by a current source, electrically connecting a plurality of electromigration detection elements to a respective NFET of the plurality of NFETs, and electrically connecting a read-out circuit to the plurality of electromigration detection elements for metering usage of each of the NFETs.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for employing electromigration detection in usage metering to prevent integrated circuit (IC) counterfeits. With continued density scaling of ICs, heat dissipation of local circuits on chips becomes growingly higher than ever, and normal operation temperature of certain areas of the integrated circuits are running hotter than the ambient temperature, especially for certain high-activity and high-load circuits such as clock buffers, and input/output (I/O) drivers, etc. Conventional on-chip temperature measurement (diode sensors) are no longer effective for monitoring certain circuit reliability degradation in these critical hot circuit areas of the IC. Specifically, electromigration in metal wires occurs when current is flowing and the wires are hot. Electromigration leads to an increase in resistance and, eventually, to breaks in the wires. It is desirable to monitor actual product circuits themselves, and take certain mitigation actions when the circuit reliability degradation reaches a predetermined safety threshold. Monitoring of electromigration is done by periodically determining if the resistance of current-carrying wires has reached the safety threshold.

Counterfeit ICs are a problem, especially in Department of Defense (DoD) applications, where old chips are recycled from old systems and sold as new. Such chips are past a certain reliability window and are prone to fail after a short period of time. The exemplary systems and methods introduce a new circuit that does not need a new process (such as non-volatile memory (NVM)) that can meter usage of the IC and show the actual "age" of an IC. Such novel and unique process depends on electromigration of copper (Cu) lines. Each field effect transistor (FET) of a circuit can be associated with an electromigration (EM) element that indicates the lifetime or lifespan of the FET. Thus, EM can be beneficially used to determine chip lifetimes.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
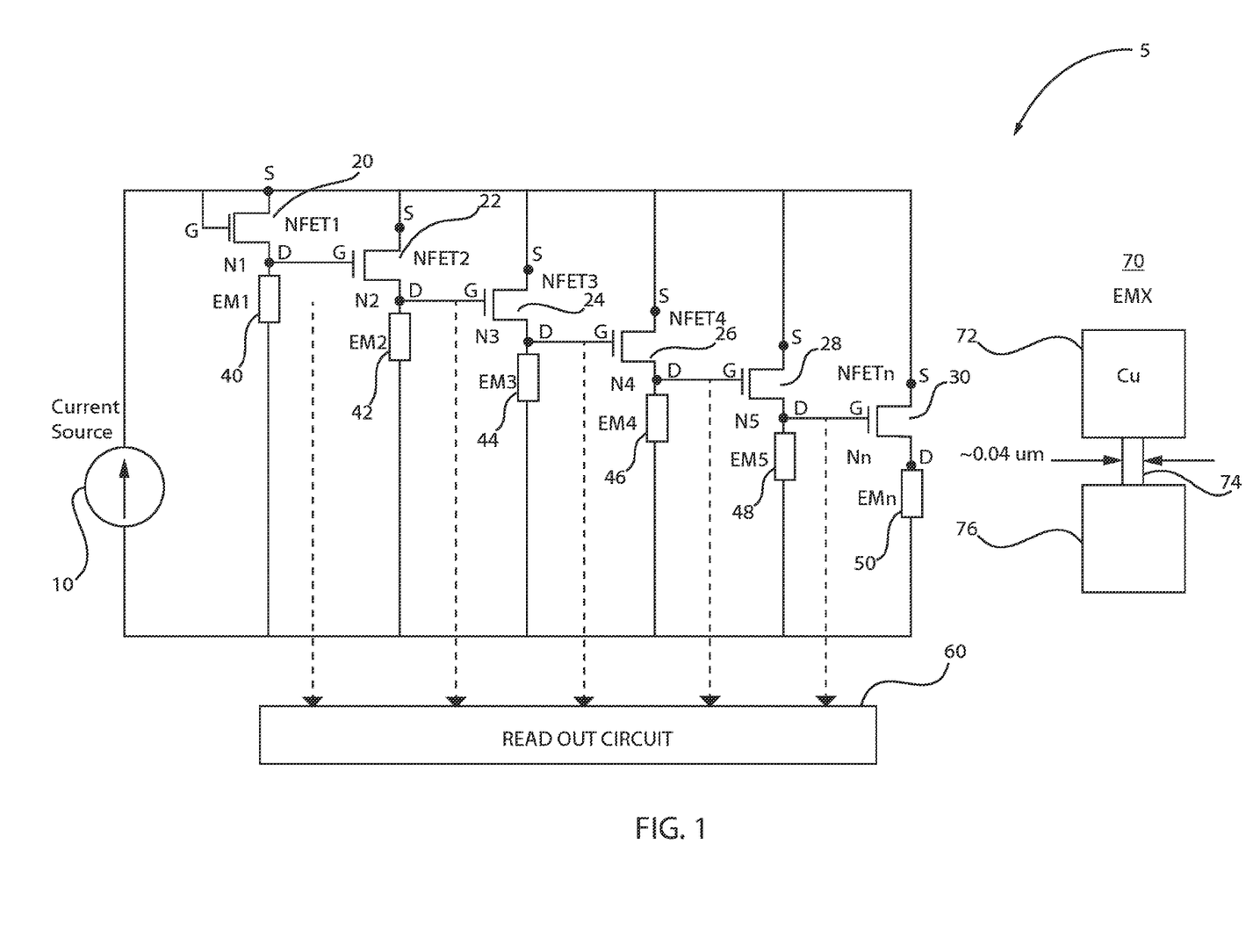
FIG. 1 shows an exemplary timer circuit, in accordance with an embodiment of the present invention.

FIG. 1 shows an exemplary timer circuit, in accordance with an embodiment of the present invention.

The timer circuit 5 includes a current source 10 for powering a plurality of n-type field effect transistors (NFETs). In the instance case, the timer circuit 5 illustrates a first NFET 20, a second NFET 22, a third NFET 24, a fourth NFET 26, a fifth NFET 28, and a sixth NFET 30. The sixth NFET 30 can be regarded as the Nth NFET in the series. Of course, one skilled in the art can contemplate a timer circuit 5 including more or less NFETs. Each NFET includes a gate (G), source (S), and drain (D).

Each NFET has an electromigration element associated with it. For example, the first NFET 20 has electromigration element 40, the second NFET 22 has electromigration element 42, the third NFET 24 has electromigration element 44, the fourth NFET 26 has electromigration element 46, the fifth NFET 28 has electromigration element 48, and the sixth NFET 30 has electromigration element 50. Each of the electromigration elements 40, 42, 44, 46, 48, 50 are connected to a read-out circuit 60.

The drain (D) connection of the first NFET 20 is electrically connected to one end of the respective electromigration element 40. Similarly, the drain (D) connection of the second NFET 22 is electrically connected to one end of the respective electromigration element 42, the drain (D) connection of the third NFET 24 is electrically connected to one end of the respective electromigration element 44, and so forth. Therefore, an N number of NFETs are provided where a drain (D) of each NFET from 1 to N-1 connects to a junction, and where a first branch of the junction connects to a gate of a subsequent NFET. Also, electromigration elements 40, 42, 44, 46, 48, 50 are each associated with an NFET and each electromigration element is connected to a second branch of the junction.

Each of the electromigration elements 40, 42, 44, 46, 48, 50 includes copper (Cu). Each of the electromigration elements 40, 42, 44, 46, 48, 50 can define a substantially or generally dog-bone or dumbbell shape 70. The dumbbell shape 70 include an upper portion 72, a lower portion 76, and a middle portion 74 connecting the upper and lower portions 72, 76. A width or thickness of the middle portion 74 can be about 0.04 μm. A width of thickness of the upper portion 72 and the lower portions 76 can be about 1 μm. The narrower portion 74 will be the area where electromigration is first realized or detected or observed or identified.

The electromigration elements 40, 42, 44, 46, 48, 50 can be referred to as electromigration detection elements or EMx elements. The NFET resistance can be about 10x the EMx resistance.

Electromigration (EM) refers to a phenomenon whereby metallic atoms are transported by electron flow at a high current density. EM is significantly affected by current density and temperature. With accumulation and depletion of atoms, EM results in a dominant failure mechanism in microelectronics that leads to the appearance of hillocks and voids, which can cause short circuits and open circuits, respectively. In particular, EM reliability issues in multilayer interconnection systems such as via structures, are more serious due to the current density concentration near the contact corner caused by the abrupt change of the geometry and mismatch in material properties.

Electrons passing through a conductor transfer some of their momentum to its atoms. At sufficiently high electron current densities, atoms may shift toward the anode side. The material depletion at the cathode side causes circuit damage due to decreased electrical conductance and eventual formation of open circuit conditions. This is caused by voids and micro-cracks, which may increase the conductor resistance as the cross-sectional area is reduced. Increased resistance alone may result in device failure, yet the resulting increase in local current density and temperature may lead to thermal runway and failure, such as an open circuit failure. Alternatively, short circuit conditions may develop due to excess material buildup at the anode. Hillocks form where there is excess material, breaking the oxide layer, allowing the conductor to come in contact with other device features. Other types of damage include whiskers, thinning, localized heating, and cracking of the passivation and inter-level dielectrics.

Therefore, for the electromigration effect phenomenon, a potential difference is applied across a metal interconnect which sets up an electric field from an anode side to a cathode side. This electric field causes the electron to move in the opposite direction of the electric field. This momentum of electron causes flow of current in the electron. These moving electrons have momentum and when they collide with the metal ions, the metal ions feel two forces in the opposite direction. One force is due to the electric field and the other force is due to a strike of electron wind. If the current density is high, the force due to electron wind is greater than the force due to the electric field.

Depending on the current density, the subjected metal ion starts drifting in the opposite direction of the electric field. If the current density is high, the interconnect may get affected from EM instantly or sometimes the effect may come after months/years of operation depending on current density. So the reliability of the IC will depend upon this EM effect. The Mean Time To Failure (MTTF) is an indication of the life span of an IC.

Back to the exemplary embodiments, each of the plurality of electromigration elements 40, 42, 44, 46, 48, 50 has a predetermined lifetime associated with it. For example, in one instance, the first NFET 20 of the plurality of NFETs is turned ON and the rest of the NFETs (22, 24, 26, 28, 30) of the plurality of NFETs are turned OFF, and when the electromigration element 40 associated with the first NFET 20 reaches a predetermined lifetime, the electromigration element 40 will be open and trigger the second NFET 22 of the plurality of FETs to turn ON. This is further illustrated below with reference to FIG. 3. The predetermined lifetime for each electromigration element can be, e.g., 1 month. Subsequently, when the electromigration element 42 associated with the second NFET 22 reaches a predetermined lifetime, the electromigration element 42 will be open and trigger a third NFET 24 of the plurality of NFETs to turn ON. The predetermined lifetime can be set to any suitable time period. In one instance, the predetermined lifetime is set to, e.g., 1 month. One skilled in the art can contemplate any other time period, such as 2 months, 3 months, 4 months, etc. One skilled in the art can contemplate each electromigration element of the timer circuit having a different predetermined lifespan associated with it. Thus, EM is beneficially or advantageously employed to determine lifespan of NFETs, and consequently, the lifespan of the IC.

Figure 2:
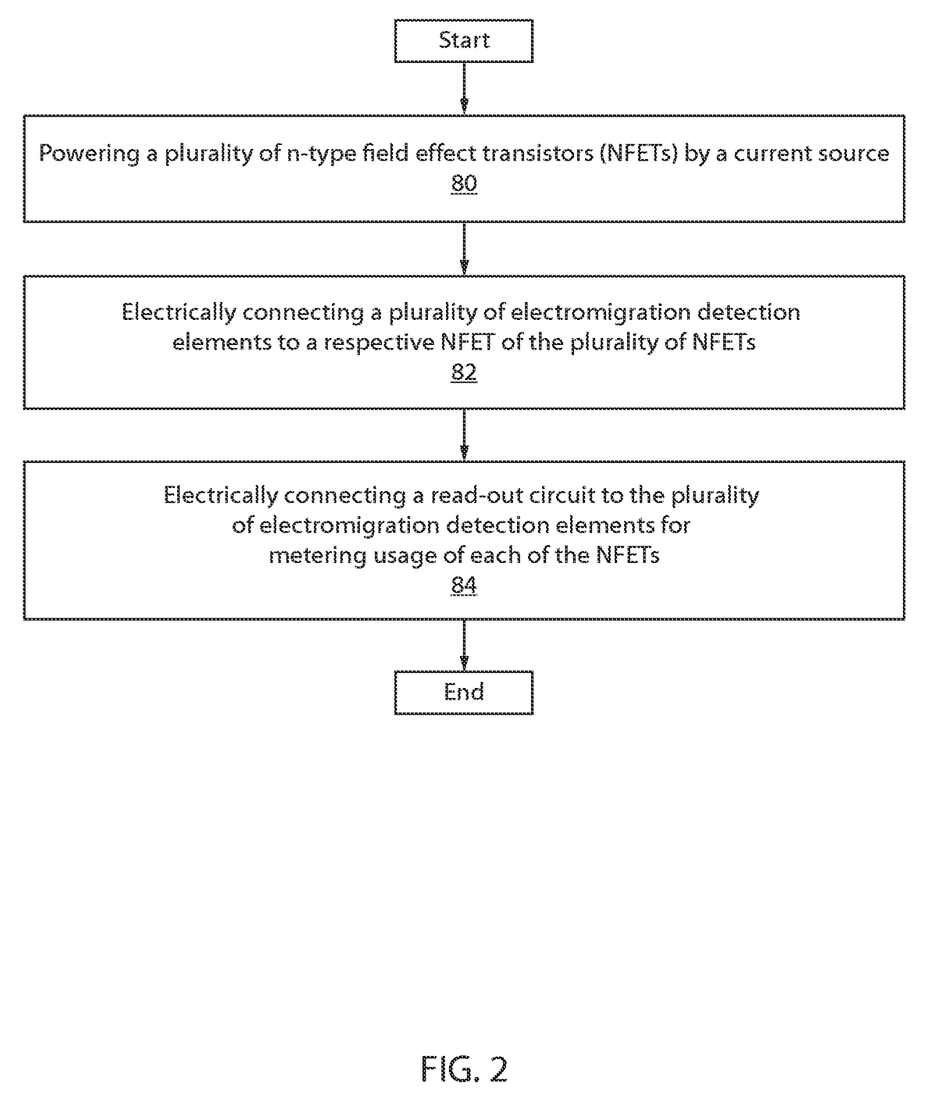
FIG. 2 is a block/flow diagram of an exemplary method for implementing usage metering to prevent integrated circuit (IC) counterfeits, in accordance with an embodiment of the present invention.

FIG. 2 is a block/flow diagram of an exemplary method for implementing usage metering to prevent integrated circuit (IC) counterfeits, in accordance with an embodiment of the present invention.

At block 80, power a plurality of n-type field effect transistors (NFETs) by a current source.

At block 82, electrically connect a plurality of electromigration detection elements to a respective NFET of the plurality of NFETs.

At block 84, electrically connect a read-out circuit to the plurality of electromigration detection elements for metering usage of each of the NFETs.

Figure 3:
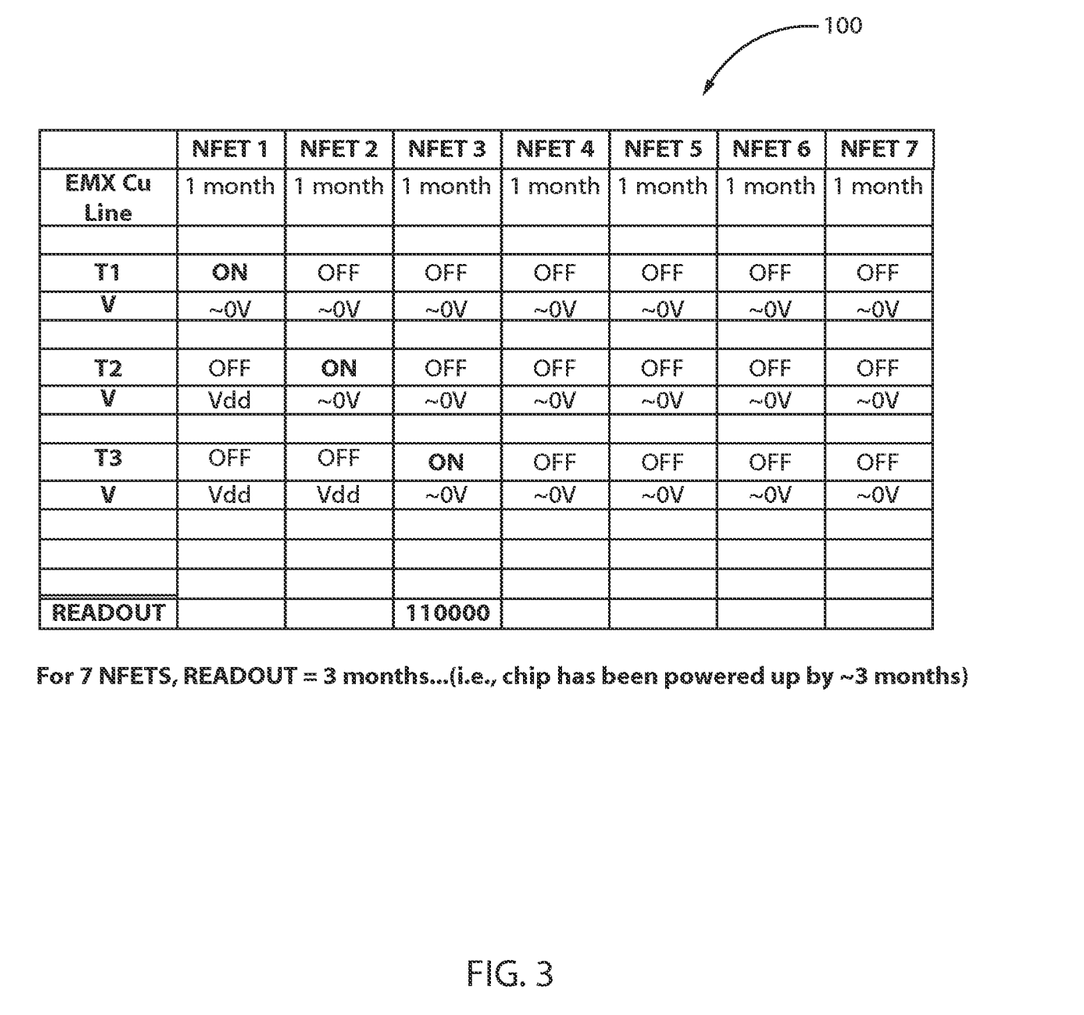
FIG. 3 is an exemplary table illustrating a sequence of operations for detecting how long a chip has been powered for, in accordance with an embodiment of the present invention.

FIG. 3 is an exemplary table 100 illustrating a sequence of operations for detecting how long a chip has been powered for, in accordance with an embodiment of the present invention.

The EMx Cu lines 40, 42, 44, 46, 48, 50 are designed so that they each have a specific or predetermined lifetime, such as, e.g., 1 month for a given current from the current source 10. Current source current can be adjusted accordingly to accommodate the desired lifetime or lifespan.

At initial IC power ON, NFET1 (20) will be ON and NFET2, NFET3... NFETn will be OFF. N1, N2, N3...Nn will be around 0 V. After a specific or predetermined time period, such as 1 month, EM1 (40) will reach the lifetime and will be open. This will force N1 to go from 0V to Vdd and turn ON NFET2 (22). After another specific or predetermined time period, such as another 1 month, EM2 (22) will reach the lifetime and will be open. This will force N2 to go from 0V to Vdd and turn ON NFET3.

At any time, the voltage of N1, N2, ....Nn can be read out by the read-out circuit 60.

For example if n=10, and the readout from the read-out circuit 60 is 1111000000, that means that the chip has been powered up by ~ 4 months.

As a result, the read-out circuit 60 reads voltages associated with each of the plurality of NFETs to provide a binary output. The binary output indicates a time frame of how long a chip associated with the timer circuit 5 has been powered ON. Therefore, it can be determined whether such chip is new or old. If it was sold as new, but has electromigration elements read out, e.g., 1111000000, then it can be deduced that such chip is not new, but recycled or old, and can be labeled as a counterfeit. As a result, the timer circuit 5 can meter the usage of the IC and determine the "age" of the IC by employing the dumbbell shaped electromigration elements including Cu.

In conclusion, EM is an electrical effect whereby electrons on an IC interconnect give some momentum to the atoms that make up the wire. This happens through low energy collisions and subsequent scattering. As a result, the interconnect deforms over time as atoms are moved along the interconnect towards the cathode. This causes pits to appear in the wire closer to the anode, and small metal bumps begin to grow along the surface of the wire closer to the cathode. This occurs at very high current densities (usually >10,000 A/cm$^2$), and the rate of EM is higher when the current density in the wire is larger. This means that EM is a runaway process. As EM occurs in one region of the wire, the cross-sectional area decreases, and the current density increases. As a result, the rate of EM also increases. Over time, more metal migrates at a faster rate, and the process eventually ends with a short circuit or an open circuit. The open circuit failure occurs when the metal along the wire is totally depleted and leaves behind a void in the wire. Thus, the component fails to operate correctly and must be replaced. However, in the instant case, the electromigration effect is detected by electromigration detection elements that are inserted into a timer circuit. In particular, the electromigration detection elements are each associated with a NFET to detect the lifespan or lifetime of the NFET. The electromigration effect is thus advantageously utilized to determine if the IC had been previously used and can thus be labeled as a counterfeit.

Figure 4:
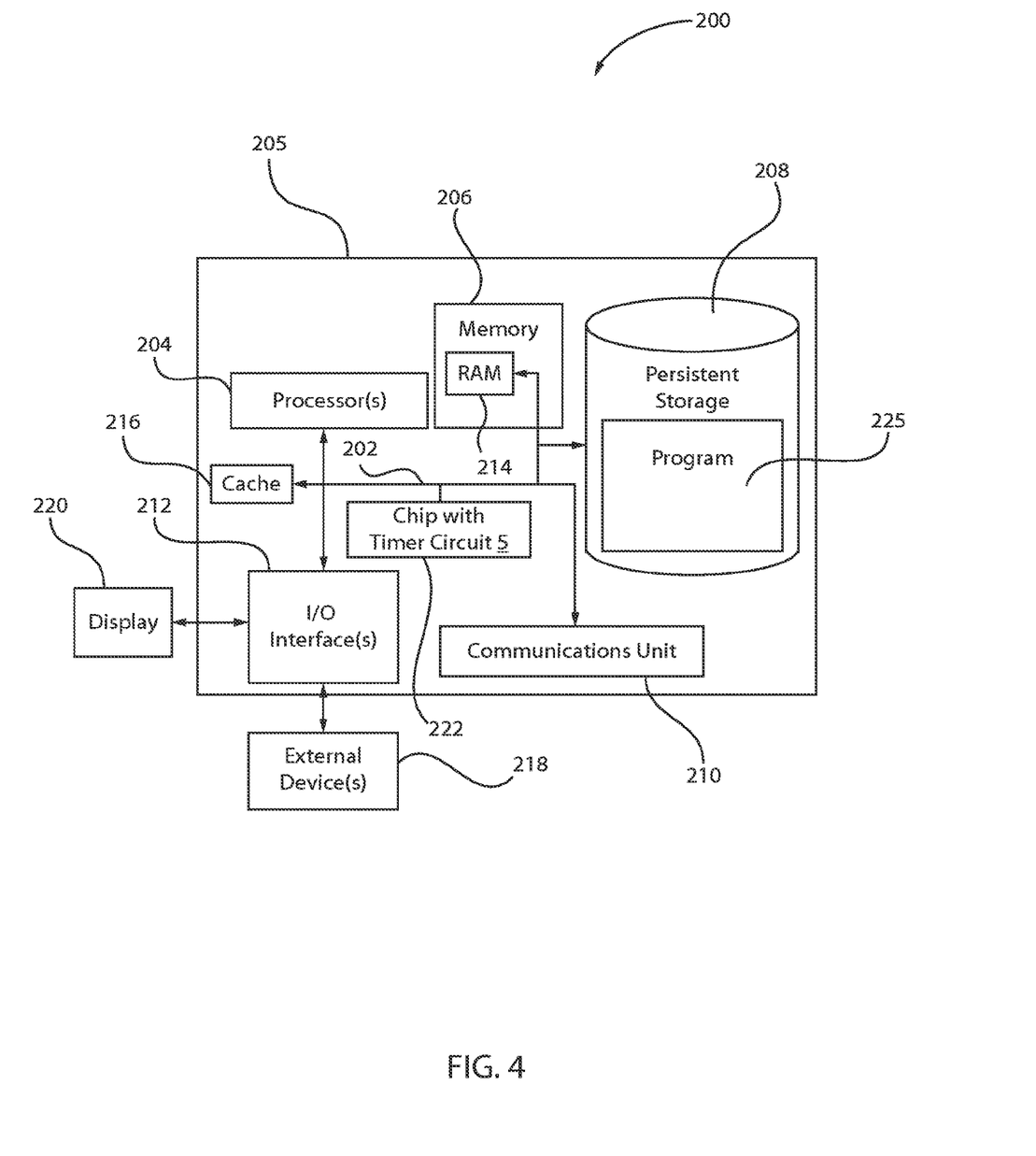
FIG. 4 is a block/flow diagram of an exemplary processing system employing a chip with the timer circuit of FIG. 1, in accordance with an embodiment of the present invention.

FIG. 4 is a block/flow diagram of an exemplary processing system employing a chip with the timer circuit of FIG. 1, in accordance with an embodiment of the present invention.

FIG. 4 depicts a block diagram of components of system 200, which includes computing device 205. It should be appreciated that FIG. 4 provides only an illustration of one implementation and does not imply any limitations with regard to the environments in which different embodiments can be implemented. Many modifications to the depicted environment can be made.

Computing device 205 includes communications fabric 202, which provides communications between computer processor(s) 204, memory 206, persistent storage 208, communications unit 210, and input/output (I/O) interface(s) 212. Communications fabric 202 can be implemented with any architecture designed for passing data and/or control information between processors (such as microprocessors, communications and network processors, etc.), system memory, peripheral devices, and any other hardware components within a system. For example, communications fabric 202 can be implemented with one or more buses.

Memory 206, cache memory 216, and persistent storage 208 are computer readable storage media. In this embodiment, memory 206 includes random access memory (RAM) 214. In another embodiment, the memory 206 can be flash memory. In general, memory 206 can include any suitable volatile or non-volatile computer readable storage media.

In some embodiments of the present invention, program 225 is included and operated by chip 222 with timer circuit 5 as a component of computing device 205. The chip 222 can employ the timer circuit 5 to determine the lifespan of a chip, as described below with reference to FIGS. 9-11. In other embodiments, program 225 is stored in persistent storage 208 for execution by chip 222 in conjunction with one or more of the respective computer processors 204 via one or more memories of memory 206. In this embodiment, persistent storage 208 includes a magnetic hard disk drive. Alternatively, or in addition to a magnetic hard disk drive, persistent storage 208 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 208 can also be removable. For example, a removable hard drive can be used for persistent storage 208. Other examples include optical and magnetic disks, thumb drives, and smart cards that are inserted into a drive for transfer onto another computer readable storage medium that is also part of persistent storage 208.

Communications unit 210, in these examples, provides for communications with other data processing systems or devices, including resources of distributed data processing environment. In these examples, communications unit 210 includes one or more network interface cards. Communications unit 210 can provide communications through the use of either or both physical and wireless communications links. Program 225 can be downloaded to persistent storage 208 through communications unit 210.

I/O interface(s) 212 allows for input and output of data with other devices that can be connected to computing system 200. For example, I/O interface 212 can provide a connection to external devices 218 such as a keyboard, keypad, a touch screen, and/or some other suitable input device. External devices 218 can also include portable computer readable storage media such as, for example, thumb drives, portable optical or magnetic disks, and memory cards.

Display 220 provides a mechanism to display data to a user and can be, for example, a computer monitor.

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to at least one processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks or modules. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks or modules.

The computer readable program instructions can also be loaded onto a computer, other programmable data processing apparatus, or other device to cause a series of operational blocks/steps to be performed on the computer, other programmable apparatus or other device to produce a computer implemented process, such that the instructions which execute on the computer, other programmable apparatus, or other device implement the functions/acts specified in the flowchart and/or block diagram block or blocks or modules.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

Having described preferred embodiments of methods and systems employing electromigration detection in usage metering to prevent integrated circuit (IC) counterfeits (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A timer circuit comprising:
   a plurality of n-type field effect transistors (NFETs) powered by a current source;
   a plurality of electromigration detection elements, where each NFET is electrically connected to a separate electromigration detection element, and where the number of the plurality of NFETs is equal to the number of the plurality of electromigration detection elements;
   a read-out circuit electrically connected to the plurality of electromigration detection elements to meter usage of each of the NFETs.

2. The timer circuit of claim 1, wherein each of the plurality of electromigration detection elements includes copper (Cu).

3. The timer circuit of claim 1, wherein at least one of the electromigration detection elements has a generally dumb-bell shape.

4. The timer circuit of claim 3, wherein a narrow section of the generally dumb-bell shape has a thickness of about 0.04 µm.

5. The timer circuit of claim 3, wherein wider sections of the generally dumb-bell shape have a thickness of about 1 µm.

6. The timer circuit of claim 1, wherein each of the plurality of electromigration detection elements has a predetermined lifetime associated with it.

7. The timer circuit of claim 1, wherein a first NFET of the plurality of NFETs is turned ON and the rest of the NFETs of the plurality of NFETs are turned OFF, and when the electromigration detection element associated with the first NFET reaches a predetermined lifetime, the electromigration detection element will be open and trigger a second NFET of the plurality of NFETs to turn ON.

8. The timer circuit of claim 7, wherein, when the electromigration detection element associated with the second NFET reaches a predetermined lifetime, the electromigration detection element will be open and trigger a third NFET of the plurality of NFETs to turn ON.

9. The timer circuit of claim 8, wherein the read-out circuit reads voltages associated with each of the plurality of NFETs to provide a binary output.

10. The timer circuit of claim 9, wherein the binary output indicates a time frame of how long a chip associated with the timer circuit has been powered ON.

11. A timer circuit comprising:
    an N number of n-type field effect transistors (NFETs), wherein a drain of each NFET from 1 to N-1 connects to a junction, and wherein a first branch of the junction connects to a gate of a subsequent NFET;
    electromigration elements each associated with an NFET and each connected to a second branch of the junction; and
    a read-out circuit connected to the electromigration elements.

12. The timer circuit of claim 11, wherein each of the plurality of electromigration detection elements includes copper (Cu).

13. The timer circuit of claim 11, wherein at least one of the electromigration detection elements has a generally dumb-bell shape.

14. The timer circuit of claim 13, wherein a narrow section of the generally dumb-bell shape has a thickness of about 0.04 µm.

15. The timer circuit of claim 13, wherein wider sections of the generally dumb-bell shape have a thickness of about 1 µm.

16. The timer circuit of claim 11, wherein each of the plurality of electromigration detection elements has a predetermined lifetime associated with it.

17. The timer circuit of claim 11, wherein a first NFET of the plurality of NFETs is turned ON and the rest of the NFETs of the plurality of NFETs are turned OFF, and when the electromigration detection element associated with the first NFET reaches a predetermined lifetime, the electromigration detection element will be open and trigger a second NFET of the plurality of NFETs to turn ON.

18. The timer circuit of claim 17, wherein, when the electromigration detection element associated with the second NFET reaches a predetermined lifetime, the electromigration detection element will be open and trigger a third NFET of the plurality of NFETs to turn ON.

19. The timer circuit of claim 18, wherein the read-out circuit reads voltages associated with each of the plurality of NFETs to provide a binary output.

20. A method comprising:
    powering a plurality of n-type field effect transistors (NFETs) by a current source;
    electrically connecting each NFET to a separate electromigration detection element of a plurality of electromigration detection elements, and where the number of the plurality of NFETs is equal to the number of the plurality of electromigration detection elements electrically connecting a read-out circuit to the plurality of electromigration detection elements for metering usage of each of the NFETs.

* * * * *